United States Patent [19]

Soltis et al.

[11] Patent Number: 4,943,558

[45] Date of Patent: Jul. 24, 1990

[54] PREPARATION OF SUPERCONDUCTING OXIDE FILMS USING A PRE-OXYGEN NITROGEN ANNEAL

[75] Inventors: Richard E. Soltis, Redford; Eleftherios M. Logothetis, Birmingham; Mohammad Aslam, Farmington Hills, all of Mich.

[73] Assignee: Ford Motor Company, Dearborn, Mich.

[21] Appl. No.: 182,261

[22] Filed: Apr. 15, 1988

[51] Int. Cl.$^5$ ............................................... B05D 5/12
[52] U.S. Cl. .......................................... 505/1; 427/62; 427/63; 427/126.3; 427/255.3; 204/192.24; 505/742; 505/731; 505/732
[58] Field of Search .............. 427/62, 63, 126.3, 255.3; 505/1, 818, 819, 742, 731, 732, 734; 204/192.24

[56] References Cited

U.S. PATENT DOCUMENTS 4,316,785 2/1982 Suzuki et al. ..................... 427/63

OTHER PUBLICATIONS

Minamikawa et al., "Preparation of $Ba_2Y Cu_3O_x$ Superconducting Films by Laser Evaporation and Rapid Laser Annealing", Jpn. J. Appl. Phys., vol. 27(4), Apr. 1988 L614–621.
Bullock et al., "Production of Superconducting $Y_1Ba_2Cu_3O_x$ Thin films by D. C. Diode Sputtering and Annealing", AIP Conf. Proc. Nov. 1987, pp. 71–78.
Mogro-Campero et al., "Superconducting $Y-B_a-C_u-O$ Thin Films by Evaporation" MRS Proc. Sym. ed. Capone II et al., (Pittsburgh 1988), pp. 113–116.
Mattews et al., "Increased Transition Temperatures in $YBa_2Cu_3O_x$ Superconducting Ceramics by Exposure to Nitrogen", Nature vol. 328, Aug. 1987, pp. 786–787.
Hammond et al., "Superconducting Thin Films of the Perovskite Superconductors by Electron-Beam Deposition" MRS Proc. Sym. ed. Gubser et al., Apr. 1987, pp. 169–171.
Gupta et al., "$Y_1Ba_2Cu_3O_{7-\delta}$ Thin Films Grown by a Simple Spray Deposition Technique", Appl. Phys. Lett. 52(2), Jan. 1988, pp. 163–165.
Gurvitch et al., "Preparation and Substrate Reactions of Superconducting Y–Ba–Cu–O Films", Appl. Phys. Lett. 51(13), Sep. 1987, pp. 1027–1029.
Aizaki et al., "$YBa_2Cu_3O_y$ Superconducting Thin Film Obtained by Laser Annealing", Jpn. J. Appl. Phys., vol. 27(2) Feb. 1988 L231–233.
"Preparation of Y–Ba–Cu–O Thin Films on MgO by de Magnetron Sputtering from a Sloichiometric $Y_1Ba_2Cu_3O_7$-w Target", Lee et al., Appl. Phys. Lett. 51(15), 12 Oct. 1987.
"Production of $YBa_2Cu_3O_{7-y}$ Superconducting Thin Films in Situ by High-Pressure Reactive Evaporation and Rapid Thermal Annealing", Appl. Phys. Lett. 51 (19) 9 Nov. 1987.
"Versatile New Metalorganic Process for Preparing Superconducting Thin Films", Gross et al., Appl. Phy. Lett. 52 (2), 11 Jan. 1988.
"Vapor Deposited High Tc Superconducting Oxide Thin Films", R. B. Laibowitz, presented in Cal. in Nov. 1987.
"High Tc Superconducting Films from Metallo-Organic Precursors", W. W. Davison et al., The Proceedings of the 1987 Fall MRS Melting, Nov. 30–Dec. 5, 1987, Boston.
"Preparation and Properties of High Tc Superconducting X–Ba–Cu–O Systems", Herrmann et al., Phys. Stat. Sol. (b) 142, K53 (1987).

Primary Examiner—Norman Morgenstern
Assistant Examiner—Roy V. King
Attorney, Agent, or Firm—Lorraine S. Melotik; Roger L. May

[57] ABSTRACT

This invention is directed to a method of preparing a superconducting metal oxide film on a substrate. More particularly, the method comprises depositing a superconducting metal oxide precursor film on the substrate and then subjecting it to annealing in an oxygen nitrogen atmosphere followed by annealing in an oxygen atmosphere, followed by rapid cooling, according to schedule wherein the time and temperature are critically defined.

11 Claims, 1 Drawing Sheet

PREPARATION OF SUPERCONDUCTING OXIDE FILMS USING A PRE-OXYGEN NITROGEN ANNEAL

TECHNICAL FIELD

This invention relates to a method of preparing a superconducting metal oxide film on a substrate using a nitrogen anneal followed by an oxygen anneal.

BACKGROUND OF THE INVENTION

The recent discovery of superconducting metal oxides such as $YBa_2Cu_3O_{7-y}$ (with $y < 0.5$) having critical temperatures, $T_c$, at least 10 to 20 K above the temperature of liquid nitrogen (77 K) has created a great deal of excitement. Heretofore known superconducting materials have much lower $T_c$'s. These superconducting metal oxides have vast potential for use in diverse applications in a large number of electrical and electronic devices which can operate at these higher temperatures. One important use of such metal oxides is in electronic components, where the oxide materials would generally be employed as a thin film, usually less than $10 \mu m$ thick, deposited on an appropriate substrate.

During the past 12 months, a great deal of effort has been devoted to the preparation of superconducting films of $YBa_2Cu_3O_{7-y}$ on various substrates. Many different techniques for depositing the film on a substrate have been explored. The film has been grown (deposited) on substrates by physical deposition techniques including electron beam evaporation, sputtering, molecular beam epitaxy, ion beam deposition, laser deposition and by chemical deposition techniques, e.g., metalorganic deposition. However, in general, the as deposited films of such materials are nonsuperconducting. They require a post growth anneal in oxygen to become superconducting. To effect the desired superconducting properties in the film material, they are usually annealed in oxygen at a temperature of 800°-950° C. and for a period of a few minutes to a few hours.

If the annealing conditions are excessive, however, they can have an adverse effect on the superconducting properties of the film by causing interdiffusion of elements of the film and the substrate. The interdiffusion can lead to interactions of the elements and result in films having poor or absent superconducting properties. Annealing temperatures and times therefore have to be optimized for a given substrate and thickness of the film.

Recent publications have described various physical deposition techniques and annealing conditions which are reported to have been successfully used to produce superconducting metal oxide films on special substrates such as $SrTiO_3$, $ZrO_2$ and MgO. In "Preparation Of Y-Ba-Cu-) Thin Films On MgO By dc Magnetron Sputtering From A Stoichiometric $Y_1Ba_2Cu_3O_{7-\delta}$ Target", Lee et al, Appl. Phys. Lett. 51 (15), 12 Oct. 1987 it was disclosed that such thin films deposited on MgO substrates, when heated above 900° C. for 1 minute become superconducting at 60 K. D. K. Lathrop et al in "Production of $YBa_2Cu_3O_{7-y}$ Superconducting Thin Films in Situ by High-Pressure Reactive Evaporation and Rapid Thermal Annealing", Appl. Phys. Lett. 51 (19) 9 Nov. 1987 deposited such films on $Al_2O_3$, $ZrO_2$ and $SrTiO_3$. They teach therein that, after deposition, such films which did not show good superconducting properties were annealed in oxygen for 1-5 minutes at 700-900° C. to improve the superconducting properties.

While the above citations are directed to films deposited by physical deposition techniques, the following citation is directed to films deposited by a chemical deposition technique, namely organometallic deposition. In "Versatile New Metalorganic Process For Preparing Superconducting Thin Films," Appl. Phy. Lett. 52 (2), 11 Jan. 1988, M. E. Gross et al disclose depositing $LnBa_2Cu_3O_{7-x}$, (Ln being a rare earth element) films on MgO and $ZrO_2$ by spin coating the film from a solution. It is taught therein that heating in $O_2$ to a maximum temperature of 800°-990° C. followed by annealing at 400° C. produces superconducting behavior in the film at $T_c$ (onset) of 89 K. The high temperature annealing of the film is limited to a maximum of 3 minutes in order to preclude significant interaction of the film with the substrate.

In all of these citations, the typical annealing schedule consists of a relatively slow heating to a peak temperature in the range of 850° to 950° C., annealing in oxygen at this temperature for a time period ranging from a few minutes to an hour, followed by a slow cooling at a rate of 1 to 3 degrees per minute. Using such an annealing schedule, $YBa_2Cu_3O_{7-y}$ films having $T_c$'s above 90 K and critical current densities above $10^6$ $A/cm^2$ have been reported in the literature as having been made on the particular substrates mentioned above.

For most electronic uses, however, the superconducting films must be grown on substrates employed in integrated circuits, such as Si, $SiO_2$ and $Si_3N_4$ substrates. Unfortunately all attempts known to us by others in the past to prepare $YBa_2Cu_3O_{7-y}$ films by physical deposition techniques on silicon and silicon dioxide substrates have given films having poor superconducting properties, i.e., low $T_c$'s. When we used the typical annealing schedule described above to anneal films deposited by physical deposition on Si and $SiO_2$ as we had used for films deposited, for example, on $SrTiO_3$, we obtained results similar to those reported in the literature, namely, the films had poor superconducting properties. Generally, such films deposited on silicon by physical deposition have a $T_c$ less than 30 K. The poor superconducting properties are attributed to the interdiffusion of one or more of the elements of the film and substrate.

In a paper presented in November of 1987 by Robert B. Laibowitz and entitled "Vapor Deposited High $T_c$ Superconducting Oxide Thin Films", it was reported that thin films of the compound $YBa_2Cu_3O_y$ were deposited on substrates such as sapphire, MgO, $ZrO_2$, $SrTiO_3$, Si and $SiO_2$. Annealing was carried out in oxygen in a conventional furnace generally at temperatures around 920° C. for about 4 minutes and the samples were cooled slowly to room temperature in the furnace. The films on all of the substrates of the paper listed above, other than Si and $SiO_2$, were reported to be superconducting. Superconducting properties were not reported for films deposited on Si or $SiO_2$, and it must be inferred that Laibowitz was not successful in making superconducting films on the silicon and silicon dioxide substrates. Similarly, in an article in the Detroit Free Press on Mar. 17, 1988, General Electric is quoted as stating that "Previous attempts to apply a superconducting film on silicon had failed because the layers mixed in the process of heating the film, known as annealing". According to that article, scientists at General Electric addressed the problem by using a buffer layer of zirconia, a heat resistant metallic oxide. It was reported that superconductive films having a $T_c$ of 87 K were obtained by using the buffer layer of zirconia between the film and the silicon substrate.

In "High $T_c$ Superconducting Films From Metallo-Organic Precursors", W. W. Davison et al, it was reported that films of $YBa_2Cu_3O_{7-x}$ deposited on silicon by metalorganic deposition have a $T_c$ of about 80 K. Reportedly, the film was about 0.7 μm thick and was annealed in oxygen for one hour at 900° C. It was also suggested in this reference that a diffusion barrier such as silver might be used between the film and the silicon. If this work is substantiated, it represents an advance in the art but provides teachings regarding only films deposited by a non-physical deposition technique, i.e., a non-vacuum-type metalorganic deposition technique.

Herrmann et al in "Preparation and Properties of High $T_c$ Superconducting Y-Ba-Cu-O Systems", Phy. Stat. Sol. (b) 142, K53 (1987) describe the effects of subjecting $(Y_{0.6}Ba_{0.4})_2CuO_{4-x}$ materials in bulk form (compressed cylinders) to various annealing procedures. It is disclosed therein that a 2 hour high temperature anneal in $N_2$ followed by a 30 minute high temperature anneal in $O_2$ followed by a 2 hour lower temperature anneal in $O_2$ gave the material a superconducting transition of 89–95 K. The reference also teaches that the cooling down of the material "from the annealing temperatures must be sufficiently slow".

BRIEF DESCRIPTION OF THE INVENTION

In the commonly assigned and concurrently filed application Ser. No. 181,863, to Aslam et al entitled "Rapid Thermal Annealing of Superconducting Oxide Films on Si and $SiO_2$ Substrates", a method is disclosed which comprises depositing a film of a superconducting metal oxide precursor on silicon and silicon dioxide substrates by physical deposition techniques and subsequently subjecting the film to a rapid thermal anneal in an oxygen atmosphere. By rapid thermal anneal is meant that the film is heated, annealed in an oxygen atmosphere, and cooled in critically controlled periods of time substantially shorter than those conventionally used. The "oxygen atmosphere" as that term is used in that application and herein, is an atmosphere comprising at least 10% by volume oxygen, any remainder other than oxygen being substantially non-reactive gas(es). Preferably, the oxygen atmosphere consists essentially of oxygen i.e., is substantially about 100% oxygen. Films produced according to that method have $T_c$s higher than those of similar films deposited on silicon and silicon dioxide substrates by vacuum deposition and annealed according to conventional (longer time) schedules.

According to the invention disclosed herein, we have found that by exposing deposited superconducting metal oxide precursor films of the type described above to an anneal in a nitrogen atmosphere prior to an anneal in an oxygen atmosphere for particularly defined periods of time, the films have improved superconducting properties as compared to such films only subjected to an anneal in an oxygen atmosphere.

This invention relates to a method of making a superconducting metal oxide film on a substrate which comprises subjecting the film to an anneal in a nitrogen atmosphere followed by subjecting the film to an anneal in an oxygen atmosphere. More particularly, according to the method, a thin film of a superconducting metal oxide precursor consisting essentially of R, Ba, Cu, and O is deposited onto a substrate in a thickness of between about 0.1 and about 3 μm (microns) to form a film/substrate composite, which precursor film can be annealed in an oxygen atmosphere to yield a superconducting metal oxide film. R is selected from the group consisting of rare earth elements and yttrium, and mixtures thereof. Preferably, the (atomic) ratio of R:Ba:Cu present in the deposited superconducting metal oxide precursor is about 1:2:3, i.e., 0.8–1.2:1.8–2.2:2.8–3.2, most preferably being the stoichiometric ratio of 1:2:3.

The film/substrate composite is then heated to a first temperature between about 400° C. and 950° C. in less than about 10 seconds and subsequently the film is annealed in a nitrogen atmosphere by maintaining the composite at the first temperature in a nitrogen atmosphere for between about 5 and 100 seconds. By nitrogen atmosphere is meant an atmosphere comprising at least 10% by volume nitrogen, wherein the remaining gases present, if any, are non-reactive gases excluding oxygen. Preferably, the nitrogen atmosphere consists essentially of nitrogen, i.e., is substantially about 100% nitrogen. The heating of the composite to the first temperature may be done in, e.g., a nitrogen atmosphere. Thereafter, the film/substrate composite is brought to a second temperature between about 800° and 950° C., which second temperature may be the same as the first temperature, in less than 10 seconds. An atmosphere of, e.g., oxygen may be present while the composite is brought to the second temperature. Then the film is annealed in an oxygen atmosphere by maintaining the composite at the second temperature in an oxygen atmosphere for about 5 to 30 seconds. Thereafter the composite is cooled to less than about 300° C., preferably to room temperature, in less than about 3 minutes, preferably in about 30 to 80 seconds. Generally, in the cooling of the composite to less than about 300° C. in less than about 3 minutes, the composite is preferably cooled to less than about 400° C. in less than 10 seconds.

If the substrate is silicon or silicon dioxide, the composite is first heated in less than about 10 seconds to a first temperature between about 400° and 700° C. and then the composite is maintained in a nitrogen atmosphere at the first temperature for about 15 to 60 seconds. Subsequently such a film/substrate composite is brought to a second temperature between about 800° to 950° C. in less than about 10 seconds and the composite is maintained at the second temperature in an oxygen atmosphere for between about 5 and 25 seconds to anneal the film. As above, the second temperature may be the same as the first temperature. The composite is then cooled as described above. If the substrate is silicon, the annealing time in the oxygen atmosphere is preferably between 8 and 12 seconds and if the substrate is silicon dioxide the annealing time in the oxygen atmosphere is preferably between about 10 and 15 seconds. Preferably, the annealing temperature in the oxygen atmosphere is 900°–920° C. The invention is also directed to an article comprising a superconducting metal oxide film on a substrate made according to this method. As understood herein, the term "superconducting" with respect to the metal oxide film means that it is superconducting at cryogenic temperatures.

Advantageously metal oxide films made according to this invention on silicon and silicon dioxide substrates have shown zero resistance near 60 K. The superconducting metal oxide film (i.e., the precursor film which has been annealed in both the nitrogen atmosphere and the oxygen atmosphere according to the invention) preferably consists essentially of $RBa_2Cu_3O_{6.5-7}$. While the invention in one aspect is directed to films on silicon and silicon dioxide, the invention method is not directed only to such films. The invention method advantageously improves the superconducting properties of films deposited on any suitable substrate including e.g., MgO, $ZrO_2$ as well as Si and $Si_2$.

BRIEF DESCRIPTION OF THE DRAWINGS

The FIGURE is a graphical representation of the resistance versus temperature for a Y/Ba/Cu/O film on a silicon dioxide substrate annealed only in an oxygen atmosphere, curve (a), and for a similar film on a silicon dioxide substrate annealed according to the invention using a pre-oxygen nitrogen anneal, curve (b), i.e., annealed in a nitrogen atmosphere and then annealed in an oxygen atmosphere.

DETAILED DESCRIPTION OF THE INVENTION

Figure 1:
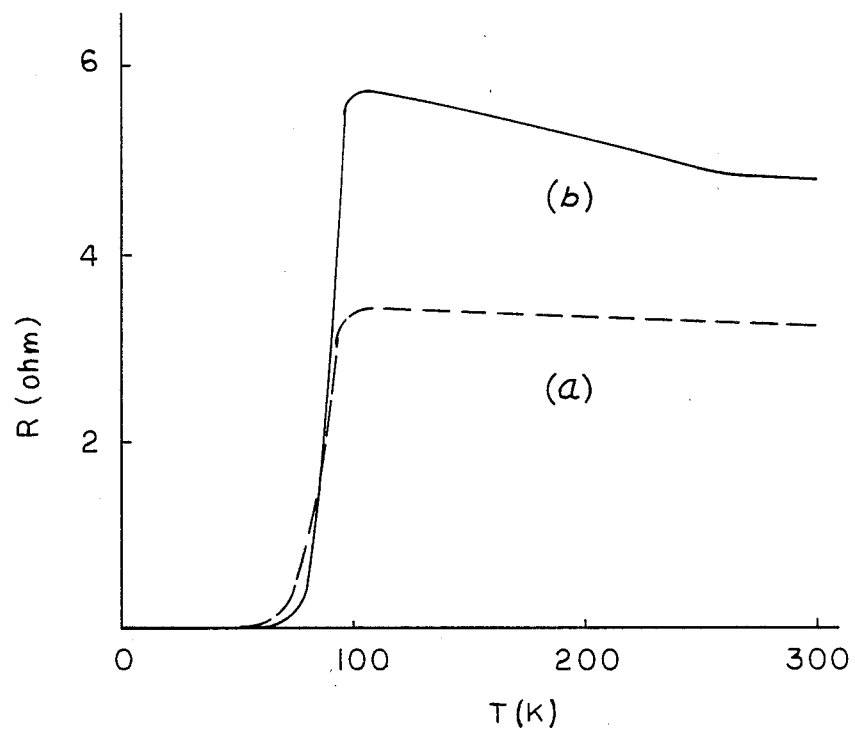

This invention is directed to a method of making a superconducting metal oxide film on a substrate. The method comprises depositing a thin film of a superconducting metal oxide precursor on a substrate to form a composite, annealing the film in nitrogen, subsequently annealing the film in oxygen and then cooling the composite relatively rapidly. The steps of the method will hereinafter be described in greater detail.

The film may be deposited on any suitable substrate, that is one which will accept a film of the superconducting metal oxide precursor and which can be subsequently annealed in a nitrogen atmosphere and then in an oxygen atmosphere according to this invention. Exemplary of substrates which can be herein employed for the method of the invention are $SrTiO_3$, $ZrO_2$, MgO, $Al_2O_3$, Si and $SiO_2$. The substrate may be of any type of such material and in any desired shape.

As discussed above, for use in electronic applications, the film would probably be employed on silicon or silicon dioxide substrates. If the film/substrate is intended for use in electronic devices, however, the substrate would probably be in the form of a wafer as is commonly used in the electronics industry. A wafer of silicon may be in the shape of a disc having two broad faces and a thin cylindrical edge surface or may be a rectangular solid having two broad faces and four thin edge surfaces. The silicon substrate may be, e.g., intrinsic, p-type or n-type, and have doping levels as are commonly used in the semiconductor industry. Generally, for electronic use the substrate would be a wafer of single crystal silicon, most preferably being single crystal silicon of (100) or (110) orientation, or be a wafer of single crystal silicon on which a silicon dioxide layer has been grown.

Prior to deposition of a film onto a silicon substrate, the surface of the silicon is preferably cleaned to remove any contaminants, e.g., organic or inorganic impurities, which may interfere with the adhesion of the film to the substrate or the electrical conductivity at the film/substrate interface. Such cleaning is routinely carried out by, e.g., using vapors of isopropyl alcohol or a solution of $H_2O_2$ and $H_2SO_4$ followed by a deionized water rinse. In the case of silicon, the substrate may subsequently be etched in buffered HF to remove any native oxide and then rinsed in deionized water. Thereafter, the silicon may be spin-dried in a nitrogen atmosphere. For optimal adhesion of the film to the silicon substrate surface, however, the chemically cleaned substrate surface is also preferably glow discharged sputter-cleaned in the deposition chamber prior to deposition of the metal oxide film.

The silicon dioxide may be formed by oxidizing a silicon substrate (which technique is well known in the art). One technique for growing the silicon dioxide on the silicon substrate by oxidizing a silicon substrate (which technique was employed in the examples below) is hereinafter described. Generally the surface of the silicon would be cleaned first according to the cleaning procedures described above. Thereafter, to grow the silicon dioxide layer, the silicon substrate is loaded into a furnace in a nitrogen atmosphere at an elevated temperature, e.g., 800° C. The temperature is raised to e.g., 1000° C., and the nitrogen gas is replaced with dry oxygen gas. After sufficient oxidation of the silicon to form a silicon dioxide film on the silicon wafer, the gas is switched back to nitrogen and the substrate is annealed, preferably for about 30 minutes. It is preferable when using as the silicon dioxide substrate a silicon dioxide film grown on silicon in this manner to saturate the oxide film by further exposure to another oxygen anneal for times much shorter (approximately 30 seconds) than the actual oxidation times. Following this anneal, the gas is again switched back to nitrogen while the temperature is lowered. Other techniques for growing silicon dioxide layers on silicon will be apparent to those skilled in the art in view of the present disclosure. A cleaned silicon substrate and the silicon substrate on which has been grown a silicon dioxide layer generally would be stored in air-tight containers prior to deposition thereon of the superconducting metal oxide precursor film. While one technique for obtaining a silicon dioxide substrate, i.e., oxidizing silicon, has been described as suitable for obtaining a silicon dioxide substrate, the silicon dioxide substrate of the invention is not limited to silicon dioxide substrates obtained in this way. For example, quartz, a commercially available form of silicon dioxide, may also be used as the silicon dioxide substrate. While the above discussion regarding cleaning and storing of the substrate has been directed to silicon and silicon dioxide substrates, techniques for cleaning and storing other substrates within the scope of this invention would be apparent to others skilled in the art in view of the present disclosure.

The superconducting metal oxide precursor film deposited on the substrate according to the invention disclosed herein consists essentially of R, Ba, Cu and O. Preferably, the (atomic) ratio of R:Ba:Cu in the precursor film is about 1:2:3, most preferably being the stoichiometric 1:2:3. R is selected from the group of elements consisting essentially of rare earth elements and yttrium. The rare earth elements are well known to those skilled in the art and include such elements as europium and neodymium.

The superconducting metal oxide precursor film is deposited on the substrate by any of the various deposition techniques, i.e., physical and chemical, well known in the art. Exemplary physical and chemical deposition techniques are listed above. According to such physical deposition techniques, the superconducting metal oxide precursor is deposited from a target or targets in a gas atmosphere wherein the target comprises one of the component materials of the film or a composite of the components of the film. The target may be in powder or compacted form. If it comprises a composite of the components of the film, they may be reacted or unreacted. In the example below wherein the precursor film was deposited by triode sputtering techniques, a target was prepared by hot pressing unreacted $Y_2O_3$, $BaCO_3$ and CuO powders. As would be apparent to those skilled in the art in view of the present disclosure, other materials such as $BaO_2$, $Cu_2O$, BaO, acetates of R, Ba and Cu, etc, may be used in making the target. In embodiments of the deposition technique wherein the target material is an oxide, the gas atmosphere may be selected from (i) inert gases, (ii) oxygen and (iii) a mixture of inert gas(es) and oxygen (a reactive gas). In those instances wherein the targets are non-oxygen materials, e.g., Y, Ba and Cu, the gas atmosphere would necessarily comprise oxygen so as to deposit an RBaCuO material on the substrate. Preferably, during deposition of the precursor film, oxygen is present in the gas atmosphere. The amount of oxygen in the gas atmosphere is generally limited somewhat by the deposition techniques employed. Generally, in the physical deposition techniques discussed herein, the inert gas employed is preferably argon.

In the triode sputtering technique used to deposit a film on the substrates in the example below, a magnetically enhanced triode sputter gun was employed utilizing a single, compressed composite target of unreacted materials. This target was semi-insulating and therefore required radio frequency (rf) sputtering electronics. In triode sputtering, electrons are generated by a Joule heated filament. These electrons are attracted to a positively charged anode (of about 50–60 volts) situated across from the filament. Inert gas, in the examples herein being argon, was admitted between the filament and anode. The inert gas is ionized by the accelerated electrons creating a plasma of electrons and positively charged inert gas ions. The target is situated just below the plasma and a transverse magnetic field confines the plasma near the target surface. The sputtering process begins when rf power is applied to the target causing it to become negatively biased (up to several hundred volts) with respect to the plasma. The positive inert gas ions are attracted to the negatively charged target such that atoms or atom complexes from the target are physically removed via momentum transfer. These target atoms are redeposited on any substrate in its line of sight. Due to different sputtering yields for each different specie in the composite target, a substantial presputtering period (up to 20 hours) is usually needed to reach equilibrium for a new target. During this presputtering period, a shutter is utilized to prevent deposition onto the substrates. After this equilibrium is attained, subsequent presputtering of the target prior to deposition of other films from the target is generally only necessary for about 10 to 15 minutes to remove any surface contamination. Oxygen gas, which is reactive with the film materials, can be admitted near the substrate to ensure essentially complete oxidation of the film. Flow meters regulate the amount of inert gas and reactive gas (oxygen) admitted into the system and the vacuum pumping system can be throttled to permit operation at a prescribed pressure developed by the gas(es). A usual operating pressure is 0.5 to 5.0 millitorr, but it can be as high as 20 millitorr. Flow rates are selected based on the size of the chamber and the pumping rate of the vacuum system employed. For example, the argon flow rates for the sputtering chamber having a volume of 100 liters (employed in the examples below) are optimally in the range of 10.0 to 35.0 standard cubic centimeters per minute (sccm); typically, 30.0 sccm is used for a chamber of that volume. The oxygen flow rate in the sputtering chamber of the examples is typically 0.1 to 5.0 sccm corresponding to a partial oxygen atmosphere of 1–3%.

The substrate is placed opposite the target at a particular distance. The actual distance depends on the desired sputtering rate and thickness uniformity and also the necessary substrate isolation to prevent excessive substrate heating and ion bombardment. In the triode sputtering technique employed in the examples, this distance lies in the range of 25 to 150 mm with a typical distance being 60 mm. The substrates can also be mounted on a resistive heater which can heat the substrates during the deposition process, generally up to a temperature of less than about 650° C. The actual temperature to which the substrate might be heated prior to film deposition depends e.g., on the substrate used and the particular post growth annealing schedule. In the case of a silicon substrate on which the superconducting metal oxide precursor film has been deposited by the triode sputtering technique of the example and annealed in a nitrogen atmosphere and then annealed in an oxygen atmosphere at 900° C. for 10 seconds according to the invention method, we have found that it is preferable that the substrate (silicon) be unheated so as to promote better adhesion of the deposited film.

Other deposition methods suitable for use in this invention for applying the film onto the substrate are described in "Deposition Technologies For Films And Coatings", R. F. Bunshah, Editor, Noyes Publications, Parkridge, NJ, 1982, which text is hereby expressly incorporated by reference for its teachings relative to physical deposition techniques. Still other physical deposition methods, suitable for applying the film to the substrate are known to those skilled in the art and would be apparent in view of the present disclosure. For example, the film can be deposited by physical deposition methods such as e-beam evaporation, ion-beam deposition, laser deposition and molecular beam epitaxy (MBE) and chemical techniques such as organometallic deposition. In any method of depositing the superconducting metal oxide precursor film onto the substrate, including the preferred rf triode sputtering method, the conditions are most advantageously arranged so as to produce a film, after annealing in a nitrogen atmosphere and an oxygen atmosphere, consisting essentially of a stoichiometric $RBa_2Cu_3O_{6.5-7}$. For a given target composition, parameters such as gas pressure, gas flow rate, power input, distance from target to the substrate can be varied and optimized to effect the formation of essentially stoichiometric metal oxide. Such optimization would be within the skill of those in the art in view of the present disclosure.

The precursor film deposited on the substrate according to this invention is deposited in a thickness of between about 0.1 and about 3 μm. The optimal thickness of the film to be deposited would depend on its desired use. Selection of the thickness of the film deposited according to this invention would be within the skill of those in the art in view of the present disclosure. It is possible to vary the methods and conditions of deposition over a considerable range while producing R/Ba/Cu/O films which may be subjected to the nitrogen anneal and oxygen anneal of the invention. Additionally, while it is not necessary according to the disclosed invention to provide a buffer layer of another material between the substrate and the superconducting metal oxide film as has been suggested, e.g., by the above mentioned General Electric article, use of such a intermediate layer or layers in intimate contact with the substrate and film is not precluded in the invention. Use of an intermediate layer may serve, e.g., to improve adhesion, etc.

As discussed above, we have found that if we heat the deposited superconducting metal oxide precursor film/substrate composite to a first temperature between about 400° C. and about 950 ° C. in less than about 10 seconds and subsequently anneal the film in a nitrogen atmosphere by maintaining the composite at the first temperature for about 15 to 60 seconds in a nitrogen atmosphere prior to subjecting the film to an anneal in an oxygen atmosphere as disclosed herein, the resulting film has improved superconducting properties as compared to films which result from superconducting metal oxide precursor films which have only been subjected to an anneal in an oxygen atmosphere. The nitrogen atmosphere of the invention comprises at least 10% by volume nitrogen, but as disclosed above, preferably consists essentially of about 100% nitrogen. The oxygen anneal schedule comprises bringing the composite, after the nitrogen anneal, to a second temperature between about 800° and 950° C. in less than 10 seconds and then annealing the film in an oxygen atmosphere at the second temperature for between 5 and 30 seconds. The second temperature may be the same as the first temperature. The oxygen atmosphere comprises at least 10% by volume oxygen and preferably consists essentially of oxygen, i.e, is 100% oxygen. The composite is then cooled to less than about 300° C., preferably to room temperature, in less than about 3 minutes, preferably in about 30 to 80 seconds. Generally, when cooling the composite to less than about 300° C. in less than about 3 minutes, the composite is preferably cooled to less than about 400° C. in less than 10 seconds. Generally, it is preferable to not cool the composite significantly after the nitrogen anneal and prior to the oxygen anneal. We have found that if the composite is not cooled significantly, e.g., to room temperature, between nitrogen and oxygen annealing, the film has better adherence to the substrate. The optimal annealing time of the film in the nitrogen atmosphere and in the oxygen atmosphere would be dependent on the thickness of the film, thicker films generally requiring longer annealing times than thinner films. Selection of optimal oxygen annealing times and temperatures will be within the skill of those in the art in view of the present disclosure.

For silicon and silicon dioxide substrates, the film/substrate is heated to a first temperature between about 400° C. and about 700° C. in less than about 10 seconds and then the composite is maintained at the first temperature in a nitrogen atmosphere for between about 15 to about 60 seconds to (nitrogen) anneal the film. Subsequently, the film is annealed in an oxygen atmosphere according to the following schedule. The composite is brought to a second temperature between 800° C. to 950° C., preferably 850°-950° C., in an oxygen atmosphere in less than about 10 seconds. The composite is then maintained at the second temperature in an oxygen atmosphere for between about 5 and 25 seconds to (oxygen) anneal the film. Most preferably, the oxygen annealing temperature is 900°-920° C. If the substrate is silicon, preferably the oxygen annealing time is 8 to 12 seconds and if the substrate is silicon dioxide the oxygen annealing time preferably is 10 to 15 seconds. The composite is cooled as disclosed above.

One way to carry out such rapid annealing steps is by means of a rapid thermal processor used in silicon device technology. It has the capability through high intensity lamps to raise the temperature of the substrate to temperatures higher than 900° C. in less than 10 seconds, and after annealing, it has the capability to cool the substrate rapidly, from 950° C. to 200°-300° C. in less than one minute. When using this processor to carry out the annealing steps of the method of this invention, the metal oxide precursor films/substrate composite is placed in the processor, such as an AG Associates Model No. 410, which is programmed to carry out an embodiment of the rapid thermal annealing schedule of the invention disclosed herein.

The invention will be further understood by referring to the following detailed example. It should be understood that the subject example is presented by way of illustration and not by way of limitation.

In the example below, the following substrate materials, processing techniques and testing procedures were used.

Silicon

P-type (100) single crystal silicon wafers having a thickness of 400 $\mu$m with resistivities of 20–30 ohm-cm were used as the silicon substrate on which was grown silicon dioxide as described below.

Cleaning Procedure

Circular wafers (i.e., disc-shaped wafers) of silicon having a diameter of 4" were first cleaned in a solution of $H_2O_2$ and $H_2SO_4$ (mixed in the ratio of 1:2 by volume) for 10 minutes. This step was followed by a 5 minute rinse in deionized water. Thereafter the native oxide was removed by a 30 second etch in buffered HF and the wafers were rinsed again in deionized water for 15 minutes after which they were spin-dried in a $N_2$ atmosphere.

Silicon Dioxide Growth

A silicon wafer cleaned by the above mentioned procedure was loaded into a furnace in a $N_2$ atmosphere at 800° C. The furnace temperature was then raised to 1000° C. and then the gas was changed from $N_2$ to dry oxygen. After 60 minutes of oxidation time the gas flow was switched back to $N_2$ and the wafer was annealed in $N_2$ for 30 minutes. This step was followed by an $O_2$ anneal for 30 seconds at 1000° C. to saturate the oxide in the $N_2$ atmosphere and the wafer was removed from the furnace.

Wafer Transport

The oxidized silicon wafer having a thickness of 50 nm) was fractured into 2"×2" samples, sealed in plastic boxes, and then transported to a sputtering system located outside the cleanroom.

Sputtering

The substrate samples were loaded into the sputtering system generally within about ten minutes after their removal from the cleanroom. The sputtering target was prepared by hot pressing at 900° C. and 8000 psi unreacted $Y_2O_3$, $BaCO_3$ and CuO powders in proportions corresponding to the stoichiometric $YBa_2Cu_3O_x$ composition. The powders remained essentially unreacted but were highly compacted with less than 5% porosity. Argon with 1 to 3% oxygen was used as the sputtering gas at a pressure in the range of 1 to 10 mTorr. The deposition rate was on the order of 100Å/min. The films were characterized by x-ray diffraction, scanning electron microscopy (SEM), transmission electron microscopy (TEM) and x-ray fluorescence.

Nitrogen and Oxygen Anneal of Metal Oxide Film

A light-powered rapid thermal processor (AG Associates Model 410) was used for the nitrogen and oxygen anneal of the superconducting metal oxide precursor film according to the method of the invention. An atmosphere of pure nitrogen (industrial grade) was used in the nitrogen annealing step. An atmosphere of pure oxygen (industrial grade) was used in the oxygen annealing step.

Electrical Measurements

The resistance of the films was measured by standard four-contact dc and ac techniques. Currents in the range of 1 to 100 $\mu$A were used and the minimum voltage detectable was on the order of 10 nV. Our zero resistivity corresponds to resistivity values of less than $10^{-7}$ ohm-cm.

EXAMPLES 1

In this example, two samples of a film of superconducting metal oxide precursor according to the method of the invention were deposited on silicon dioxide. The silicon dioxide was grown on wafers of silicon exposed to oxygen as described above. The metal oxide films were deposited by the triode sputtering system techniques described above in the following way. The substrate was mounted on a resistive heater, the deposition chamber was closed and the vacuum pumping system was turned on to evacuate the chamber to low pressures, below about $10^{-6}$ torr. The target was formed as described above. A shutter was placed between the substrate and the target, the sputtering gas was admitted into the chamber and the triode gun was turned on. After a few minutes of presputtering, the shutter was removed and the deposition of the Y/Ba/Cu/O film on the silicon dioxide substrate began. After a time period of 200 minutes, a Y/Ba/Cu/O film 2 $\mu$m thick was deposited on the silicon dioxide substrate. Subsequently, the sputter gun was turned off, the chamber was brought to atmospheric pressure and the substrate with the film was removed. The as-deposited film on the substrate was amorphous and highly resistive (non-superconducting). The film was then processed by means of a AG Associates model 410 rapid thermal processor according to the following schedule.

One of the samples of the composite was heated to 500° C. in 3 seconds in a nitrogen atmosphere and annealed at that temperature for 30 seconds. At the end of the nitrogen anneal, the atmosphere was changed to oxygen and the temperature was raised to 920° C. in 3 seconds. The film was annealed for 10 seconds in an oxygen atmosphere at 920° C. and then cooled to room temperature in 100 seconds. The film had an onset of $T_c$ above 95 K and a $T_c(0)$ above 66 K as shown in the FIGURE as curve (b).

The second of the samples of the composite was annealed only in the oxygen atmosphere as in this example, i.e., it was not subjected to the nitrogen anneal. The film had a $T_c(0)=50$ K as shown in the FIGURE as curve (a).

In view of the disclosure, many modifications of this invention will be apparent to those skilled in the art. It is intended that all such modifications which fall within the true scope of this invention be included within the terms of the appended claims.

We claim:
1. A method of making a superconducting metal oxide film on a substrate, said method comprising:
    depositing a thin film of a superconducting metal oxide precursor consisting essentially of R, Ba, Cu, and O onto said substrate in a thickness between about 0.1 and 3 $\mu$m to form a film/substrate composite, wherein R is selected from the group consisting of rare earth elements and yttrium, which precursor film can be annealed in an oxygen atmosphere to yield a superconducting metal oxide film;
    then heating said film/substrate composite to a first temperature between about 400° and 950° C. in less than about 10 seconds;
    then maintaining said composite at said first temperature in an oxygen free nitrogen atmosphere between about 5 and
    then bringing said film/substrate composite to a second temperature between about 800° C. and 950° in an oxygen atmosphere in less than about 10 seconds;
    then maintaining said film/substrate composite at said temperature in the oxygen atmosphere for between about 5 and 30 seconds to anneal said film; and
    then cooling said film/substrate composite to less than 300° C. in less than about 3 minutes.
2. The method according to claim 1, wherein the ratio of R:Ba:Cu present in said superconducting metal oxide precursor is 0.8–1.2:1.8–2.2:2.8–3.2.
3. The method according to claim 2, wherein said ratio of R:Ba:Cu is 1:2:3.
4. The method according to claim 1, wherein said film of said superconducting metal oxide consists essentially of $RBa_2Cu_3O_{6.5-7.0}$.
5. The method according to claim 1, wherein said film is deposited by sputtering.
6. The method according to claim 1, wherein said substrate is selected from the group consisting of silicon and silicon dioxide, and wherein (a) said first temperature is between about 400° and 700° C.; (b) said composite is maintained at said first temperature in said nitrogen atmosphere between about 15 and 60 seconds to anneal said film; and (c) said film/substrate composite is maintained at said second temperature in said oxygen atmosphere for between about 5 and 25 seconds to anneal said film.
7. The method according to claim wherein said substrate is silicon and said film is annealed in said oxygen atmosphere for between about 8 and about 12 seconds.
8. The method according to claim 6, wherein said substrate is silicon dioxide and said film is annealed in said oxygen atmosphere for between about 10 and 15 seconds.
9. The method according to claim 6, wherein said film is annealed in said oxygen atmosphere at a first temperature between about 850° C. and 950° C.
10. The method according to claim 1, wherein said R is yttrium.
11. A method of making a superconducting metal oxide film on a substrate selected from the group consisting of silicon and silicon dioxide, said method comprising:
    depositing a thin film of a superconducting metal oxide precursor consisting essentially of R, Ba, Cu, and O by a physical deposition technique onto said substrate in a thickness between about 0.1 and 3 mm to form a film/substrate composite, wherein R is selected from the group consisting of rare earth elements and yttrium, which precursor film can be annealed in an oxygen atmosphere to yield a superconducting metal oxide film;

then heating said film/substrate composite to a first temperature between about 400° C. and 700° C. in less than about 10 seconds;

then maintaining said film/substrate composite at said first temperature in an oxygen free nitrogen atmosphere for between about 15 and 60 seconds to anneal said film;

then bringing said film/substrate composite to a second temperature between about 800° C. and 950° C. in less than about 10 seconds;

then maintaining said film/substrate composite at said second temperature in the oxygen atmosphere for between about 5 and 25 seconds to further anneal said film; and then cooling said film/substrate composite to less than 300° C. in less than about 3 minutes.

* * * * *